United States Patent [19]

Elliott et al.

[11] Patent Number: 5,068,524
[45] Date of Patent: Nov. 26, 1991

[54] MULTIPLE HETEROSTRUCTURE PHOTODETECTOR

[75] Inventors: Charles T. Elliott; Anthony M. White, both of Malvern, England

[73] Assignee: The Secretary of State for Defence in Her Britannic Majesty's Government of the United Kingdom of Great Britain and Northern Ireland, London, England

[21] Appl. No.: 571,587
[22] PCT Filed: Nov. 24, 1989
[86] PCT No.: PCT/GB89/01406
§ 371 Date: Aug. 23, 1990
§ 102(e) Date: Aug. 23, 1990
[87] PCT Pub. No.: WO90/06597
PCT Pub. Date: Jun. 14, 1990

[30] Foreign Application Priority Data

Dec. 5, 1988 [GB] United Kingdom ............... 8828348

[51] Int. Cl.$^5$ .................... H01J 40/14; H01J 27/14; G01J 5/20
[52] U.S. Cl. .................... 250/211 J; 357/30; 250/338.4; 250/370.13
[58] Field of Search ............... 357/30 B, 30 E; 250/370.13, 338.4, 211 J

[56] References Cited

U.S. PATENT DOCUMENTS

| | | | |
|---|---|---|---|
| 3,904,879 | 9/1975 | Amingual et al. | 250/338.4 |
| 4,137,544 | 1/1979 | Koehler | 357/30 B |
| 4,553,152 | 11/1985 | Nishitani | 250/370.13 |
| 4,679,063 | 7/1987 | White | 250/338.4 |
| 4,791,467 | 12/1988 | Amingual et al. | 357/30 E |

OTHER PUBLICATIONS

Shanley et al., "Wide Bandwidth, High Sensitivity Hg$_{0.8}$Cd$_{0.2}$Te Photodiodes for CO$_2$ Laser Applications," SPIE, vol. 227, CO$_2$ Laser Dev. and Appl. (1980), pp. 123-132.
Stelzer et al., "Mercury Cadmium Telluride as an Infrared Detector Material", IEEE Transactions on Electron Devices, vol. ED-16, No. 10, 10/69, pp. 880-884.

Primary Examiner—David C. Nelms
Assistant Examiner—Michael Messinger
Attorney, Agent, or Firm—Nixon & Vanderhye

[57] ABSTRACT

A photodetector (10) of the non-equilibrium kind incorporates three successively disposed sections (14, 16, 18) of like layer construction. Each of the sections (e.g. 14) contains three layers (14A, 14B, 14C) of semiconductor materials of the Cd$_x$Hg$_{1-x}$Te alloy system (CMT). The central layer (14B) of each section (14) is of narrow bandgap CMT, i.e. x=0.19 or 0.265 for absorption at 3–5 μm or 8–12 μm, and has very low doping ($10^{15}$ cm$^{-3}$) providing intrinsic conductivity. It is 1.5 μm thick, less than one third of an optical absorption length. The outer layers of each section (14A, 14B) are 10 μm thick and are of wide bandgap CMT, i.e. x=0.4. They have respective n and p type dopant concentrations of $3 \times 10^{16}$ cm$^{-3}$ providing extrinsic conductivity. Each central layer (14B) is therefore bounded by an excluding contact (14AB) and an extracting contact (14BC), which depress its carrier concentration to an extrinsic level under the action of electrical bias. This simulates cooling to low temperature. The central layers (14B to 18B) have a collective thickness (4.5 μm) approaching an optical absorption length (6 μm). A mirror (20) is arranged to return through the photodetector (10) radiation transmitted by it. This presents a total active region thickness six times that of an individual central region (14B) and greater than an optical absorption length. The photodetector (10) consequently has high quantum efficiency despite the deficiencies of n-type CMT material in this regard.

5 Claims, 2 Drawing Sheets

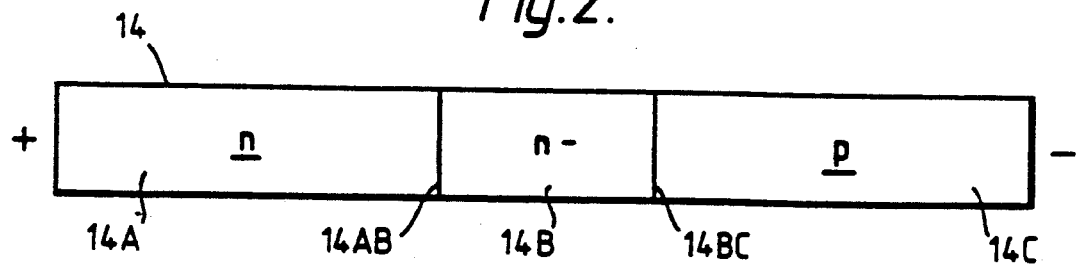
Fig.2.
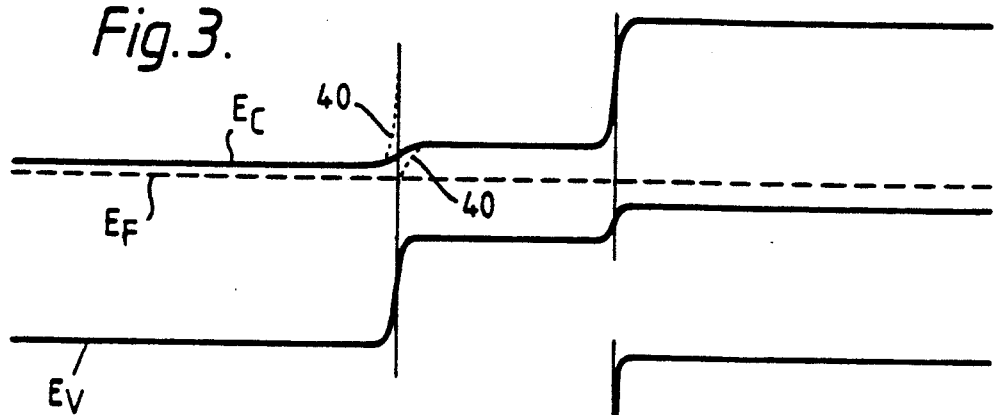
Fig.3.
Fig.4.
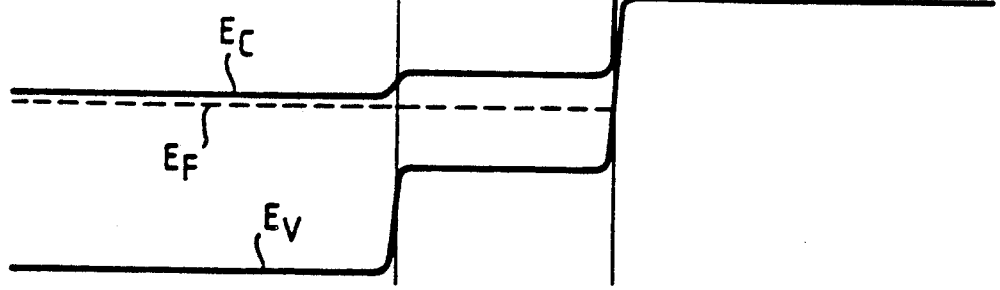
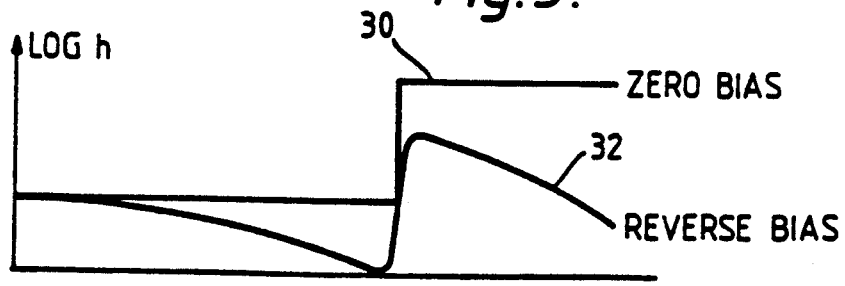
Fig.5.

MULTIPLE HETEROSTRUCTURE PHOTODETECTOR

This invention relates to a photodetector of the kind which is responsive to photon absorption.

Photodetectors are distinguished from other forms of radiation detectors in that they respond to photons received from a thermal scene. Thermal detectors such as pyroelectric detectors rely on the change in some physical property as a function of temperature to sense the temperature variation in a scene.

Photodetectors such as photodiodes and photoconductive devices are well known in the prior art. They are made of semiconducting material, and respond to photon absorption by creation of an electron-hole pair. In a photoconductor, an external bias voltage sweeps out such charge carriers, and photons are detected from increase in bias current. Alternatively, photodiodes may be operated in a photovoltaic mode without external bias. In this case, the internal electric field in the photodiode at its pn junction is responsible for charge separation.

In order to achieve high photodetector responsivity, the fractional change in charge carrier density produced by an incident photon flux should be as large as possible. Consequently, the minority carrier density in the absence of illumination should be as low as possible. This also maximises signal to noise ratio, since noise arises from fluctuations in carrier density and will be low if carrier density is low. In narrow bandgap semiconductor materials at moderate or high temperatures, the generation rate of minority carriers is itself proportional to the number of carriers. This is in fact the dominant source of noise in near intrinsic or n-type narrow bandgap materials. To improve responsivity and reduce noise, infrared photodetectors may be cooled to low temperature to reduce the free carrier concentration. This is particularly relevant to photodetectors of narrow bandgap semiconductor materials such as cadmium mercury telluride (CMT), i.e. $Cd_xHg_{1-x}Te$ where the value of x is adjusted according to the required detection wavelength interval. Detection in the atmospheric transmissive wavelength intervals 3-5 $\mu$m and 8-12 $\mu$m requires x equal to 0.28 and 0.205 respectively. An example of a CMT photoconductive detector is described in British Pat. No. 1,488,258 (U.S. Pat. No. 3,995,159). Such detectors are cooled to 190° K. for operation at 3-5 $\mu$m, and to 80° K. for operation at 8-12 $\mu$m. At ambient temperature, about 300° K., they exhibit predominantly intrinsic conductivity; i.e. the charge carrier concentration is largely due to ionisation of valence electrons. When cooled to the appropriate operating temperature, the intrinsic contribution to conductivity is greatly reduced. Conductivity then becomes dominated by dopant impurities and is therefore extrinsic. As has been said, cooling to the extrinsic conductivity regime enhances photodetector responsivity and signal to noise ratio.

The requirement to cool CMT photodetectors to low operating temperatures is a severe disadvantage to their use. It is only tolerated because, when cooled, such detectors have excellent properties in other respects, e.g. high detectivity (D*), responsivity and quantum efficiency. However, it is necessary for conventional CMT photodetectors to be associated with refrigeration apparatus consisting of a cooling engine or Joule Thompson cooler. This adds greatly to the weight, cost and bulk of photodetection apparatus, and is a severe limitation to its use in man-portable systems in particular.

To overcome the cooling requirement problem, it has been proposed to achieve carrier concentration reduction by other means. This is described in European Patent Application No. EPA 0,167,305, and also by Elliott and Ashley in Electronics Letters, May 9, 1985, Vol. 21, No. 10, pp. 451-452. A photodetector is disclosed in which non-equilibrium effects are employed to reduce the carrier concentration. The device described is a three layer pp$^-$n heterostructure of CMT materials. Here the subscript bar (−) and its absence under p or n indicates relatively wide and relatively narrow bandgap CMT material respectively. The minus sign superscript to p indicates very low doping and residual p type; p$^-$ is also referred to as $\pi$-type. In the pp$^-$n device, the pp$^-$ junction acts as an excluding contact; i.e. it readily accepts holes (majority carriers) from the central p$^-$ region under bias, but is unable to act as a source of electrons (minority carriers) in return. The p$^-$n junction is reverse biased in operation, and so it acts as an extracting contact to which electrons diffuse from the p$^-$ central region. The result is that the p$^-$ region becomes denuded of electrons which cannot be effectively replenished from the p region. This effect occurs at distances within a minority carrier diffusion length of the p$^-$n junction provided that there is no generating contact nearby providing a minority carrier source. The electron or minority carrier concentration in the p$^-$ region is consequently reduced when the device is biased. The intrinsic contribution to the hole (majority carrier) concentration is also reduced because of the electron concentration reduction to preserve charge neutrality conditions. The overall charge carrier concentration in the p$^-$ region is therefore reduced under device bias as it would be by cooling. Since the dominant carriers in the p$^-$ region arise from intrinsic conductivity, large reductions in carrier concentration are potentially obtainable. This approach therefore offers the performance of a cooled device without the need for cooling, or at least a significant reduction in the requirement for cooling capacity.

Similar non-equilibrium photodetectors are described in the above prior art based on p$^+$p$^-$n$^+$ structures, where the plus sign indicates a high doping level.

The foregoing prior art non-equilibrium photodetector of EPA 0,167,305 is distinguished from conventional photodiodes as follows. As has been said, it consists of a pp$^-$ junction linked by an active p$^-$ region to p$^-$n junction. The p$^-$n junction has a depletion region (with associated electric field) which extends into the p$^-$ region a distance less than 0.3 $\mu$m. There are also charge redistribution effects associated with the pp$^-$ junction giving rise to an electric field extending into the p$^-$ region a distance less than 0.3 $\mu$m. The p$^-$ region is at least 6 $\mu$m in thickness. It is characterised by a substantially field-free central region more than 5.4 $\mu$m thick, together with much smaller outer regions influenced by electric fields associated with the pp$^-$ and p$^-$n junctions. When an electrical bias voltage is applied to the photodetector reverse-biasing the p$^-$n junction, the central region remains effectively field-free because here the bias field is negligible in practice. Charge carriers created in the central p$^-$ active region reach the n and p outer regions predominantly by virtue of diffusion, which is affected very little by bias voltage effects.

It is also known to make photovoltaic cells from semiconductor heterostructures, as described in U.S. Pat. No. 4,776,894. This discloses p-i-n (pin) diode structures formed from an undoped amorphous silicon layer sandwiched between higher bandgap layers of silicon alloyed with carbon and nitrogen respectively and of opposite conductivity type. The neutral i region is 0.08 μm (800 Angstroms) thick, or, in devices having p-i-n/p-i-n structures, 0.08 μm in the first diode and 0.4 μm in the second. In such a device the electric fields due to diode depletion regions extend through the undoped (or lightly doped) i region.

The proposed prior art non-equilibrium devices of EPA No. 0,167,305 suffer from the disadvantage that p$^-$ CMT material is extremely difficult to manufacture because the technology is not well established. The p$^-$ device region is the most critical one in terms of photodetector performance, since it is this region which absorbs photons and requires carrier concentration reduction. It must be less than a minority carrier diffusion length in extent so that exclusion/extraction effects occur throughout its volume under bias. It must also be at least as long as, and preferably longer than, an optical absorption length in extent, in order to provide a high probability of photon absorption with associated high quantum efficiency and detectivity. CMT detectors of all varieties are normally 8–10 μm thick because the absorption length is 6 μm. In practice, p$^-$ material is both difficult to make and difficult to characterise once made. Surface effects tend to dominate electrical transport, and an n-type surface layer may short circuit the underlying p$^-$ bulk. It is difficult to achieve low doping levels and long carrier lifetimes. These problems indicate that non-equilibrium photodetectors would have a high failure rate and low manufacturing yield.

It is possible to consider designing a non-equilibrium photodetector having an n$^-$ central or active region, instead of a p$^-$ equivalent as in the prior art described above. In this connection, the technology required to produce n$^-$ CMT material is well established. However, as might be inferred from the absence of any description of such a device in the prior art, there are good reasons why it would not be viable. The diffusion length in n$^-$ CMT for minority carriers (holes) under extracted conditions is about 2 μm at near ambient temperature. As has been said, the active region of a non-equilibrium photodetector must be less than the minority carrier diffusion length in thickness for extracted conditions to prevail within it. However, the optical absorption length in n$^-$ CMT is about 6 μm, this being the length over which the fractional absorption and quantum efficiency are $(1-1/e)$ or about 63%. For acceptable quantum efficiency, the thickness of the active photodetector region must be greater than an optical absorption length. However, extracted conditions can only be obtained in n$^-$ CMT over distances up to 2 μm, one third of an optical absorption length. Consequently, the advantages of reduced carrier concentration under extracted conditions are outweighed by greatly reduced quantum efficiency.

It is an object of the invention to provide an alternative form of non-equilibrium photodetector.

The present invention provides a photodetector comprising a semiconductor multilayer structure characterised in that the structure has a plurality of successively disposed sections each having three respective layers, the three layers consisting of a relatively narrow bandgap residual n-type central layer sandwiched between relatively wide bandgap outer layers doped n-type and p-type respectively, the central layer being sufficiently thin to exhibit minority carrier extraction throughout its thickness when biased and having sufficiently low doping to exhibit predominantly intrinsic conductivity at a device operating temperature when unbiased, and the outer regions being sufficiently thick to inhibit minority carrier injection into the central region and having sufficiently high doping to provide extrinsic conductivity at the operating temperature.

The invention provides the advantage that the problems of low quantum efficiency of an extracted n$^-$ photodetector layer are overcome by employing a plurality of such layers arranged in series, each layer being provided with respective excluding and extracting contacts in the form of interfaces with outer layers. The n$^-$ central layers may have thicknesses which are individually less than an absorption length, since the photodetector has their collective thickness for absorption.

In a preferred embodiment, the photodetector is formed from the $Cd_xHg_{1-x}Te$ alloy system. The value of the compositional parameter x is in the range $1 \leq X \leq 0.35$ for the outer layers of each section. For the central layer of each section, x is equal to 0.265 or 0.19 according to whether the photodetector is required to operate in the 3–5 μm wavelength interval or that at 8–12 μm. The outer layers preferably have dopant concentrations greater than or equal to $10^{16} cm^{-3}$, and that of each central layer is preferably less than or equal to $3 \times 10^{15} cm^{-3}$.

The photodetector may incorporate a mirror arranged to reflect light transmitted by the photodetector back through it for further absorption.

In order that the invention might be more fully understood, an embodiment thereof will now be described, with reference to the accompanying drawings, in which:

FIG. 2 is a schematic drawing of a region of the FIG. 1 photodetector shown on an enlarged scale and rotated through a right angle;

FIGS. 3 and 4 are band structure drawings for the FIG. 2 region in unbiased and biased conditions; and FIG. 5 illustrates graphically the effect of bias on the minority carrier concentration in the FIG. 2 region.

Figure 1:
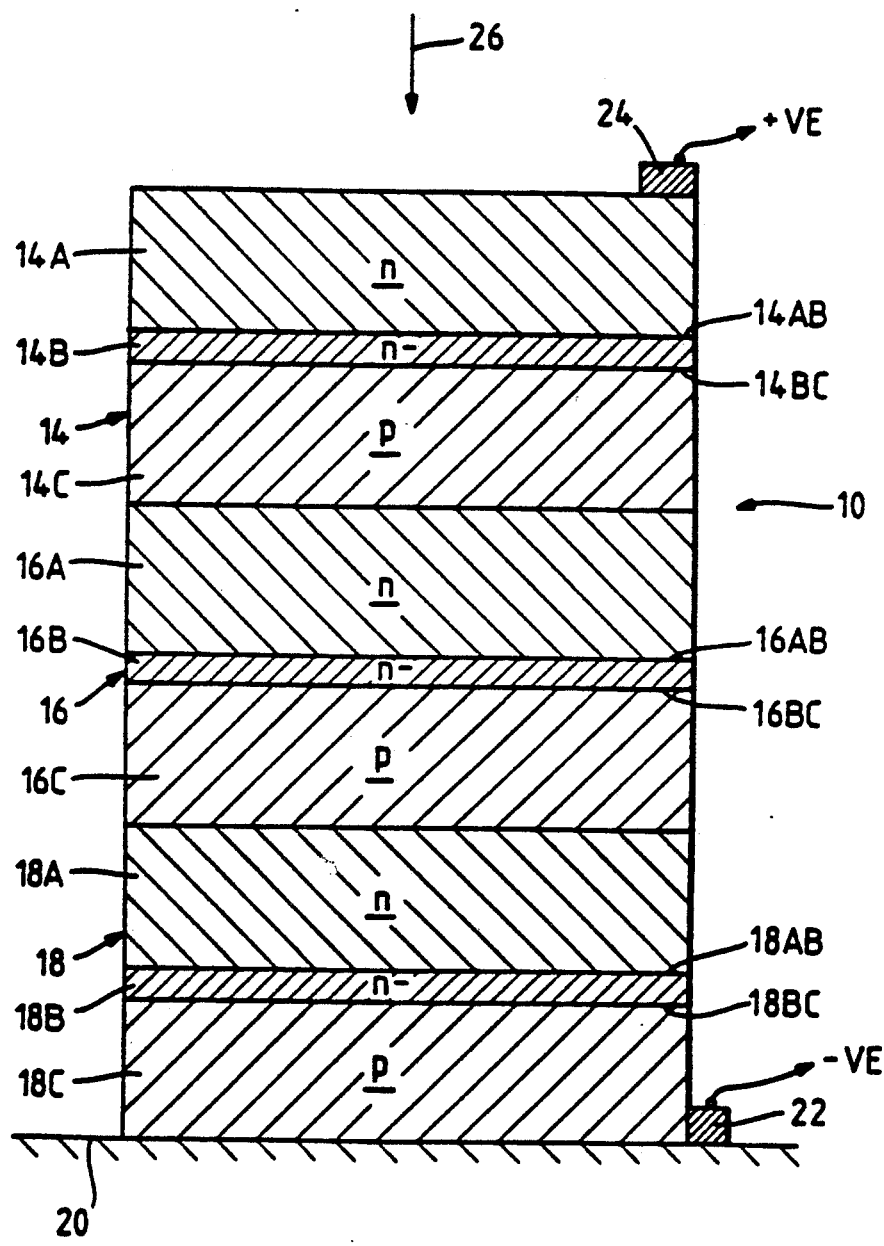
FIG. 1 is a schematic sectional drawing of a photodetector of the invention.

Referring to FIG. 1, an infrared photodetector 10 of the invention is illustrated schematically in cross-section. The photodetector 10 is of multilayer construction, and comprises semiconductor materials of the cadmium mercury telluride (CMT) system; i.e. the materials are $Cd_xHg_{1-x}Te$, where the value of x differs in different photodetector regions. A larger value of x corresponds to a greater semiconductor bandgap.

The photodetector 10 incorporates three successively disposed sections 14, 16 and 18, each section having three layers indicated by suffixes A, B and C; e.g. section 14 has layers 14A, 14B and 14C. Interfaces between adjacent layers are indicated by both layer suffixes. Accordingly, interfaces 14AB and 14BC lie between layers 14A–14B and 14B–14C respectively.

The A layers 14A, 16A and 18A are formed of relatively wide semiconductor bandgap CMT material. The value of the compositional parameter x of $Cd_xHg_{1-x}Te$ is 0.4. The A layers are 10 μm thick and have an n-type dopant concentration of $3 \times 10^{16} cm^{-3}$. These layers are designated n, the bar subscript indicating relatively wide semiconductor bandgap.

The B layers 14B, 16B and 18B are 1.5 μm thick, and consist of relatively narrow bandgap CMT material (x=0.19) with a low residual n-type dopant concentration of $1\times10^{15}$ cm$^{-3}$. This is indicated by the designation n−, in which lack of a bar subscript indicates narrow gap and the minus sign low doping. The interfaces 14AB, 16AB and 18AB are nn− heterojunctions between different semiconductor materials. They are formed as gradual transitions where the value of x changes from 0.4 to 0.19 smoothly over a distance of 0.3 μm. This avoids the creation of conduction band discontinuities between layers. The low residual n-type doping produces intrinsic conductivity characteristics at a temperature of 190° K.

The C layers 14C, 16C and 18C are p type, i.e. they are of relatively wide bandgap CMT material (x=0.4) with a p-type dopant concentration of $3\times10^{16}$ cm$^{-3}$. The C layers are 10 μm in thickness. There is no necessity for a gradual change from x=0.19 to x=0.4 at interfaces 14BC to 18BC. These interfaces are np junctions, strictly speaking n−p heterojunctions.

The lowermost layer 18C is adjacent to a mirror 20, and has a negative bias electrode 22. The uppermost layer 14A has a positive bias electrode 24. The photodetector 10 is arranged to detect incident light in the wavelength range 8–12 μm indicated by an arrow 26. The B layers are absorptive and the A and C layers are transmissive in this wavelength interval, which corresponds to photon energies above the B layer bandgap but below that of the A and C layers. Referring now also to FIGS. 2 to 5, the section 14 is shown once more in FIG. 2 together with corresponding electrical characteristics in underlying FIGS. 3 to 5. The section 14 is shown with its thickness dimension magnified and disposed horizontally, in order to facilitate comparison with FIGS. 3 to 5. Of the latter, FIGS. 3 and 4 are band structure drawings indicating the Fermi level $E_F$, the conduction band minimum $E_C$ and the valance band maximum $E_V$ for zero bias (equilibrium) and reverse bias of the n−p junction 14BC. Dotted lines 40 in FIG. 3 indicate a conduction band discontinuity which would have formed in the absence of grading of the interface 14AB. In FIG. 5, the hole (minority carrier) concentration h is plotted as graphs 30 and 32 against distance through the thickness of the section 14 for the zero bias and reverse bias conditions respectively. The vertical axis has a logarithmic scale, and h appears plotted as log h.

The photodetector 10 operates as follows. The sections 14, 16 and 18 are equivalent and are in series electrically. The n−p junctions 14BC, 16BC and 18BC are all reverse biased by virtue of bias electrodes 22 and 24. The behaviour of the sections 14 to 18 is exemplified by that of section 14 shown in FIGS. 2 to 5. By virtue of zero bias in FIG. 3, the Fermi level $E_F$ is constant through the three layers 14A, 14B and 14C. $E_F$ is close to the conduction band minimum $E_C$ in layer 14A by virtue of the n-type doping of this layer. Similarly, $E_F$ is near the valence band maximum $E_V$ in layer 14C since this layer is doped p-type. Since the central layer 14B is virtually undoped, albeit residual n-type or n−, $E_F$ is nearer to the conduction band minimum in this layer. As shown in FIG. 4, the effect of introducing a reverse bias is to introduce a shift in $E_F$, $E_C$ and $E_V$ at the interface 14BC.

The change in minority carrier (hole) concentration h in layers 14A and 14B as a result of biasing is illustrated in graphs 30 and 32. Under zero bias, as shown in graph 30, log h is at constant levels in layers 14A and 14B. The level in layer 14A is below that in layer 14B by virtue of the higher degree of n-type doping concentration in the former. Under bias, as shown in graph 32, the value of h is greatly reduced at the interfaces 14AB and 14BC in particular, and is also reduced in consequence throughout the central layer 14B. This is because the nn− interface 14AB acts as an excluding contact, and the n−p interface 14BC acts as an extracting contact. The reverse bias experienced by the section 14 operates to drive electrons to the left and holes to the right in FIGS. 2 to 5. However, in the layer 14A there are very few holes (minority carriers) since it is n-type. In consequence, it rapidly becomes depleted of holes adjacent the interface 14AB under the action of bias. The positive electrode 24 is a source of holes, but is distant 10 μm from the interface 14AB; i.e. the electrode 24 is separated from the interface 14AB by a distance greater than the hole diffusion length. Consequently, holes removed from the interface AB under bias cannot be completely replenished by diffusion from the electrode 24, and the hole concentration at the interface 14AB falls. Necessarily, the intrinsic contribution to the electron concentration at the interface 14AB falls also, to maintain charge neutrality conditions. As a result, the total (electron+hole) charge carrier concentration at the interface 14AB is reduced.

Turning now to the interface 14BC, this is an n−p junction acting as an extracting contact. Holes in the central layer 14B are attracted to the interface or junction 14BC by virtue of reverse bias, the interface 14BC acting as a sink for holes. Consequently, holes are removed from the central layer 14B by the biased junction 14AB. As shown in graph 32, the hole concentration in layer 14B is very low adjacent the interface 14BC. As has been said, the reduction in the hole concentration in the central layer 14B cannot be remedied by diffusion from the contact 24 via the layer 14A, since the contact is too remote. Because the minority carrier concentration in layer 14B is reduced, the intrinsic contribution to the electron concentration is reduced also to maintain charge neutrality. Consequently, the overall carrier concentration in the central layer 14B is reduced under bias so that it becomes extrinsic; i.e. the charge carriers available for conduction are predominantly those arising from impurity (n-type doping) states. Intrinsic conductivity arising from charge carriers produced by thermal ionisation of valence electrons has been inhibited by the action of the excluding contact 14AB and the extracting contact 14BC. This suppression of intrinsic conductivity simulates the effects produces by cooling. It is important to note that the layer 14B must not have any electrical connections which might inject holes into it, since this would nullify the exclusion/extraction effects.

The hole extraction effect in the layer 14B is greatest immediately adjacent the n−p junction 14BC. As shown in graph 32, the effect reduces with distance from the junction 14BC. It extends approximately up to one hole diffusion length from the junction 14BC. In consequence, the thickness of the n− layer 14B is required to be less than one hole diffusion length in extent in order to provide for carrier extraction effects to occur throughout this layer. The relevant hole diffusion length is that under extracted conditions, which is about 2 μm in n− CMT. The thickness of the layer 14B is therefore required to be less than 2 μm, and is 1.5 μm in the present example.

The layer 14B absorbs approximately 23% of infrared radiation 26 incident on it in the 8-12 μm wavelength band; i.e. the single-pass quantum efficiency is 23%. As has been mentioned, the adjacent layers 14A and 14C are transparent to this wavelength band. Radiation which is not absorbed by the layer 14B passes into the second section 16, which operates in the same manner as section 14. Layer 16B consequently absorbs 23% of the radiation reaching it. Radiation transmitted by section 16 passes to section 18 for absorption in layer 18B. Radiation transmitted by section 18 is reflected at the mirror 20, and returns for further absorption in layers 18B, 16B and 14B in succession. The total percentage absorption and quantum efficiency arising from three B layers with double light pass is $1-(1-0.23)^6$, or about 78%.

The photodetector 10 is designed to detect wavelengths in the range 8-12 μm and to operate at a temperature of 250° K. At this temperature, the B layers 14B to 18B exhibit intrinsic conductivity under zero bias. When the photodetector 10 is reverse biased, as has been said exclusion/extraction effects reduce the intrinsic contribution to the charge carrier concentration sufficiently to produce extrinsic conductivity in the B layers, simulating the effect of cooling to liquid nitrogen temperatures (80° K.).

A photodetector of the invention may also be arranged to detect infrared radiation in the 3-5 μm wavelength interval. Such a device is generally as previously described, except that the compositional parameter x of $Cd_xHg_{1-x}Te$ becomes 0.265. The value of x is not critical in the A and C layers, provided that they have sufficiently wide bandgap for transparency to the radiation of interest. This is satisfied for $1 \geq X \geq 0.35$, the range within which the previously quoted value lies (x=0.4). Irrespective of the operating wavelength interval, the neutral donor concentration $(N_D-N_A)$ in A layers and the neutral acceptor concentration $(N_A-N_D)$ in C layers should be greater than or equal to $10^{16}$ cm$^{-3}$. Here $N_D$ and $N_A$ are the donor and acceptor impurity concentrations respectively. $N_D$ in the B layers should be less than or equal to $3 \times 10^{15}$ cm$^{-3}$.

We claim:

1. A photodetector comprising a semiconductor multilayer structure (10) characterized in that the structure (10) has a plurality of successively disposed sections (14, 16, 18) each having three respective layers (e.g. 14A, 14B, 14C), the three layers consisting of a relatively narrow bandgap residual n-type central layer (14B) sandwiched between relatively wide bandgap outer layers (14A, 14C) doped n-type and p-type respectively, the central layer (14B) being sufficiently thin to exhibit minority carrier extraction throughout its thickness when biased and having sufficiently low doping to exhibit intrinsic conductivity at an operating temperature when unbiased, and the outer regions (14A, 14C) being sufficiently thick to inhibit minority carrier injection into the central region (14B) and having sufficiently high doping to provide extrinsic conductivity at the operating temperature.

2. A photodetector according to claim 1 characterized in that it is formed of $Cd_xHg_{1-x}Te$ material, where x is equal to at least 0.35 in the outer layers (e.g. 14A, 14C) and is equal to 0.19 or 0.265 in each central layer (e.g. 14B) according to whether the operating wavelength interval is 8-12 μm or 3-5 μm.

3. A photodetector according to claim 2 wherein said outer layers dopant concentration is at least $10^{16}$ cm$^{-3}$ and that of each central layer (e.g. 14B) is not greater than $3 \times 10^{15}$ cm$^{-3}$.

4. A photodetector according to claim 1, wherein a portion of light incident therein is transmitted through said sections, including a mirror (20) arranged to retroreflect light.

5. A photodetector according to claim 1 including three successively disposed sections (14, 16, 18).

* * * * *